US006804119B2

(12) United States Patent
Ziemkowski

(10) Patent No.: US 6,804,119 B2
(45) Date of Patent: Oct. 12, 2004

(54) METHOD AND EDGE CONNECTOR PROVIDING ELECTROSTATIC DISCHARGE ARREST FEATURES AND DIGITAL CAMERA EMPLOYING SAME

(75) Inventor: Ted Ziemkowski, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 121 days.

(21) Appl. No.: 10/209,136

(22) Filed: Jul. 31, 2002

(65) Prior Publication Data

US 2004/0022030 A1 Feb. 5, 2004

(51) Int. Cl.[7] ................................................. H05K 7/20
(52) U.S. Cl. ...................... 361/715; 361/760; 361/720; 361/748; 361/794; 439/951; 439/924.1
(58) Field of Search ............................... 361/715, 776, 361/775, 785, 789, 720, 760, 794, 799, 748; 439/181, 951, 924.1

(56) References Cited

U.S. PATENT DOCUMENTS

| | | | |
|---|---|---|---|
| 2,066,240 A | 12/1936 | Verdun | 439/181 |
| 4,849,944 A | * 7/1989 | Matsushita | 714/718 |
| 4,985,870 A | * 1/1991 | Faraci | 365/228 |
| 5,160,273 A | 11/1992 | Carney | 439/108 |
| 5,164,880 A | 11/1992 | Cronin | 361/220 |
| 5,210,855 A | 5/1993 | Bartol | |
| 5,319,523 A | 6/1994 | Ganthier et al. | 361/753 |
| 5,647,853 A | 6/1997 | Landry et al. | |
| 5,768,163 A | 6/1998 | Smith, II | 364/705.01 |
| 5,842,885 A | 12/1998 | Takamoto et al. | 439/607 |
| 5,919,064 A | 7/1999 | Petersen et al. | 439/637 |
| 6,024,587 A | 2/2000 | Garth | 439/101 |
| 6,079,620 A | 6/2000 | Wu et al. | 235/441 |
| 6,124,779 A | * 9/2000 | Yamamoto | 336/200 |
| 6,165,018 A | * 12/2000 | Arnett et al. | 439/620 |
| 6,201,704 B1 | 3/2001 | Poplawski et al. | 361/753 |
| 6,220,873 B1 | 4/2001 | Samela et al. | 439/76.1 |
| 6,247,947 B1 | 6/2001 | Knoernschild | |
| 6,275,882 B1 | 8/2001 | Cheever et al. | 710/103 |
| 6,393,222 B1 | * 5/2002 | Nakagawa et al. | 396/287 |

FOREIGN PATENT DOCUMENTS

EP 04369463 A 7/1991

* cited by examiner

Primary Examiner—David Martin
Assistant Examiner—Hung Bui

(57) ABSTRACT

A connector, particularly suited for use in a digital camera, having electrostatic discharge features that prevent the occurrence of electrostatic discharge events. The connector comprises a printed circuit board that includes a ground contact, a power contact, and a plurality of signal contacts that are offset from an edge of the printed circuit board. A row of vias are disposed between the signal contacts and the edge of the printed circuit board, and adjacent opposite sides of each of the signal contacts, that attract electrostatic energy before it can reach the signal contacts. The signal contacts have different lengths and shapes, depending upon their purpose. An electrostatic discharge protection method and digital camera are also disclosed.

9 Claims, 2 Drawing Sheets

METHOD AND EDGE CONNECTOR PROVIDING ELECTROSTATIC DISCHARGE ARREST FEATURES AND DIGITAL CAMERA EMPLOYING SAME

TECHNICAL FIELD

The present invention relates generally to electrical connectors, and more specifically, to an edge connector having electrostatic discharge arrest features and digital camera employing same.

BACKGROUND

The assignee of the present invention manufactures digital cameras, and other computer-related devices. One current design of the assignee of the present invention for a digital camera has a docking connector on the bottom.

Since this docking edge connector needs to be used without a user plugging something in (for example just setting the camera in its base) the best type of connector is an edge connector. One problem with this type of connection, is that it leaves the signals exposed. This is undesirable from an electrostatic discharge (ESD) standpoint.

One solution is to protect these signals from electrostatic discharge events with electronic devices, such as clamp diodes, capacitors, or ferrite devices, and the like. However, this is a bad solution from a cost and space standpoint. Furthermore, electrostatic discharge (ESD) devices or doors on the product are expensive and requires more space in the product.

U.S. Pat. No. 5,066,240 discloses "A high density electrical connector comprised of a block of insulative material having a plurality of electrical contacts for providing plural electrical connections and an electrical conductor for providing electrostatic discharge protection for the electrical contacts mounted thereto. The electrical conductor is positioned forward of the electrical contacts relative to the leading edge of the insulative material, thereby protecting the electrical contacts from electrostatic discharges. In alternate embodiments of the invention, the electrical connector may be a plug type electrical connector with the electrical conductor mounted on the leading edge of the projecting blades or may be a receptacle type electrical connector with the electrical conductor mounted to the leading edge of the insulative insert."

U.S. Pat. No. 6,079,620 discloses "A board adapter for electrically transmitting signals between an electrical card connector and a mother board, includes a plurality of signal traces formed on both faces of the board adapter for electrically connecting signal holes with corresponding conductive pads. The signal holes respectively receive the corresponding contacts of the card connector. The conductive pads electrically engage with corresponding contacts disposed within a receiving slot defined in a card edge connector when the board adapter is inserted therein and stabilizing means ensures proper engagement therebetween. The stabilizing means comprises a cutout defined on a bottom edge of the board adapter and a post formed in the receiving slot of the card edge connector. The engagement between the cutout and the post ensures that the conductive pads of the board adapter are properly aligned with the contacts of the card edge connector."

U.S. Pat. No. 5,319,523 discloses that "The main system printed circuit board of a computer is mounted on a tray structure that also supports other CPU components of the computer and is removably insertable into the housing portion of the computer. A specially designed card edge connector portion of the system board is operatively insertable into a socketed connector on another circuit board interiorly mounted within the housing. Electrically conductive signal fingers and grounding fingers are respectively mounted on first and second sides of the card edge, with the signal fingers being connected to the signal plane of the system board, and the grounding fingers being connected to its ground plane. A sacrificial grounding pad is positioned on the second side of the edge connector portion, between the grounding pads and its leading edge, and is initially engaged by the internal connector contact strips, as the card edge is being inserted into the connector, to equalize any voltage potential between the two circuit boards before the contact strips engage the signal and grounding fingers. The grounding pad thus eliminates the necessity of incorporating clamping diodes in the system board circuitry to avoid ESD damage to its components. The initially engageable grounding pad also serves as a sacrificial contact wear member that lengthens the connectivity life of the system board by diminishing the mechanical wear-away of the signal and grounding fingers."

However, none of these patents disclose or suggest the use of signal contacts are displaced inwardly away from the edge of the connector that have different lengths and shapes, depending upon their purpose and a row of vias in the connector that attract electrostatic energy before it can reach the signal contacts.

What is desirable is a connector structure that prevents electrostatic discharge events from ever reaching the signal pins. Accordingly, it is an objective of the present invention to provide for an improved docking edge connector that prevents electrostatic discharge from occurring. It is also an objective of the present invention to provide for digital camera employing the improved docking edge connector.

SUMMARY OF THE INVENTION

To accomplish the above and other objectives, the present invention provides for a docking edge connector having electrostatic discharge features that prevent the occurrence of electrostatic discharge events. To prevent the occurrence of electrostatic discharge events, the present invention provides a row of vias in the connector that attract electrostatic energy before it can reach the signal contacts. Furthermore, the signal contacts are displaced inwardly away from the edge of the connector and have different lengths and shapes, depending upon their purpose.

One advantage of the present invention over what has been done before is that it is virtually cost free, eliminating the need for discrete electrostatic discharge devices. The present invention substantially reduces or eliminates electrostatic discharge problems for exposed edge-connectors.

BRIEF DESCRIPTION OF THE DRAWINGS

The various features and advantages of embodiments of the present invention may be more readily understood with reference to the following detailed description taken in conjunction with the accompanying drawings, wherein like reference numerals designate like structural elements, and in which.

DETAILED DESCRIPTION

Figure 1:
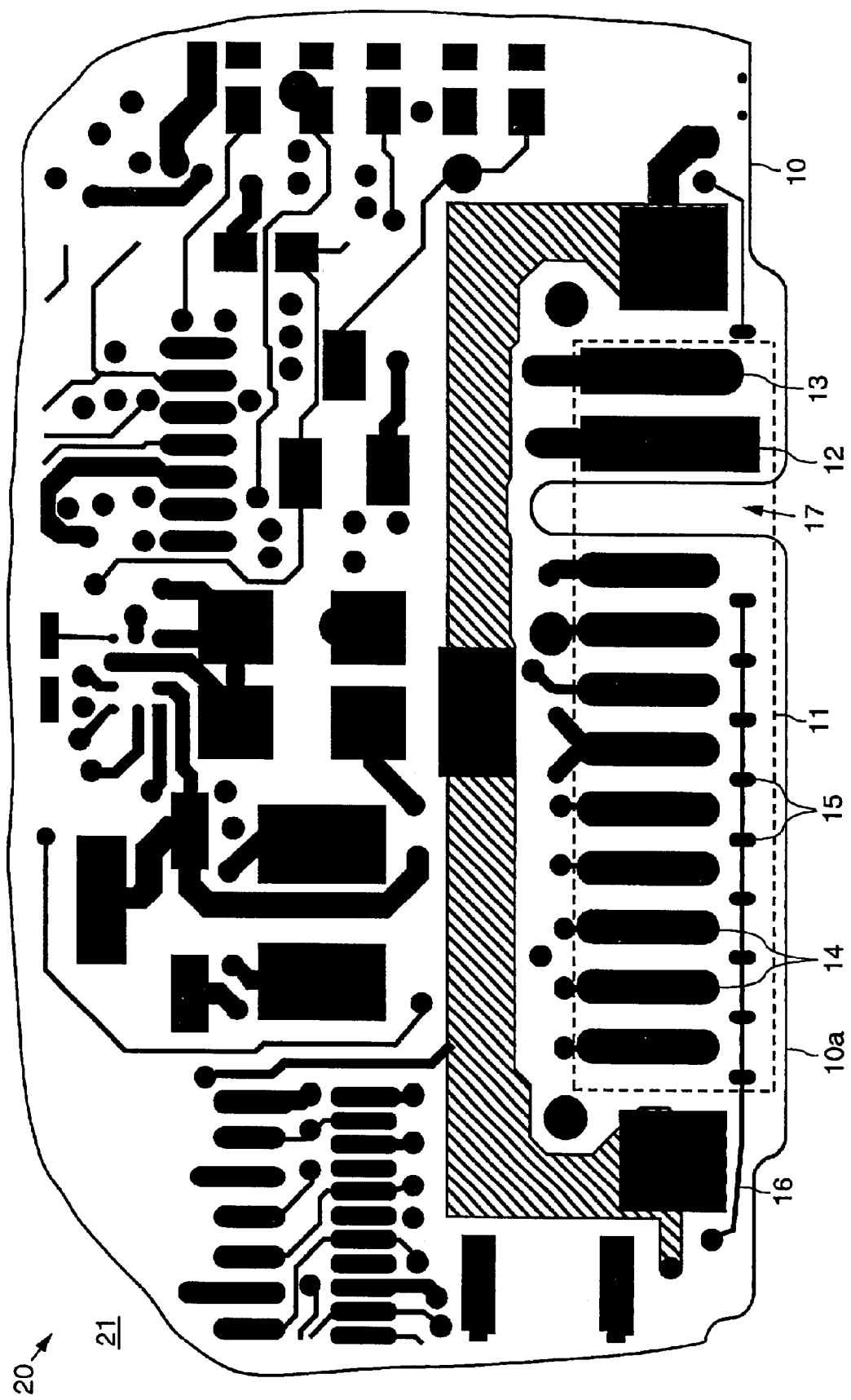
FIG. 1 illustrates an exemplary embodiment of a circuit board of a digital camera having an edge connector in accordance with the principles of the present invention.
Figure 2:
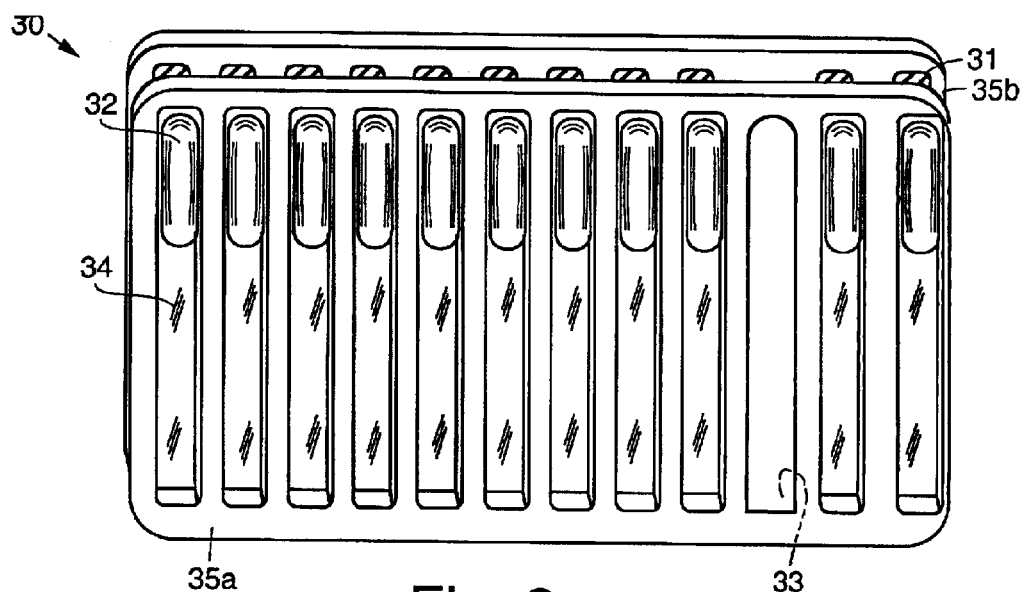
FIG. 2 illustrates an exterior view of an exemplary embodiment of a female portion of the present edge connector.
Figure 3:
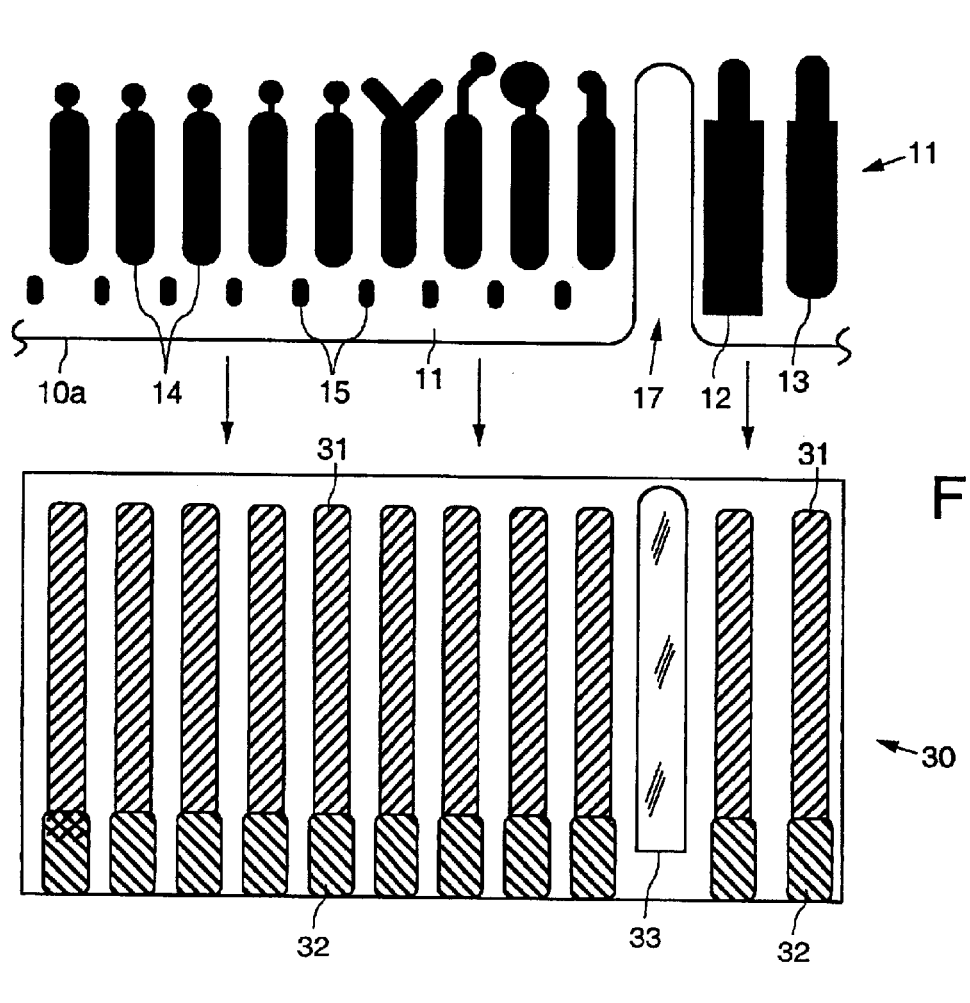
FIG. 3 illustrates an exterior view of the exemplary embodiment of the female portion of the edge connector shown in FIG. 2.

Referring to the sole drawing figures, FIG. 1 illustrates an exemplary embodiment of a circuit board 10 of a digital camera 20. The digital camera 20 comprises a body 21 (generally designated) in which the circuit board 10 is housed. FIG. 2 illustrates an exterior view of an exemplary embodiment of a female portion 30 of the edge connector 11. FIG. 3 illustrates an exterior view of the exemplary embodiment of the female portion 30 of the edge connector 11 shown in FIG. 2.

The circuit board 10 comprises an edge connector 11 in accordance with the principles of the present invention. A male portion 25 of the edge connector 11 is shown in FIG. 1. The male portion 25 of the edge connector 11 has a plurality of fingerlike contacts 12, 13, 14 including a ground contact 12, a power contact 13, and a plurality of signal contacts 14.

Each of the finger contacts 12, 13, 14 are located at predetermined distances from the outeredge 10a of the circuit board 10. The finger contacts 12, 13, 14 are located at predetermined distances based upon the signals that they receive. The ground contact 12 has a square tip that helps attract the electrostatic discharge signals. The ground contact 12 is also the longest contact to provide a ground connection before power or signal contacts 13, 14 are contacted. A slot 17 is provided at the edge 10a of the circuit board 10 that is used to align the male portion 25 of the edge connector 11 in the female portion 30 of the edge connector 11.

The power contact 13 is located on the right side of the ground contact 12 and is the next longest contact. The power contact 13 applies power to the circuit board 10 before any signal contact 14 is contacted. The signal contacts 14 are the furthest from the edge 10a of the circuit board 10.

Referring to FIGS. 2 and 3, the female portion 30 of the edge connector 11 comprises first and second offset circuit members 35a, 35b having a plurality of connector wipers 31 that are coupled to a corresponding plurality of conductive members 32. The plurality of conductive members 32 reside in a corresponding plurality of slots 34 formed in each of the offset circuit members 35a, 35b. A guide or registration member 33 is sized to fit the slot 17 in the circuit board 10, to register the male and female portions 25, 30 of the edge connector 11 when they are mated.

Referring again to FIG. 1, embodiments of the present invention provide for a row of vias 15 that are disposed between the signal contacts 14 and the outer edge 10a of the circuit board 10. Each respective edge connector signal contact 14 has a via 15 disposed on either side thereof. The vias 15 are disposed between the edge connector signal contacts 14 so that connector wipers 31 (FIG. 3) do not get damaged by the vias 15. The shape of the vias 15 is elongated to provide better electrostatic discharge attraction. The vias 15 are connected to an electrostatic discharge reference voltage (ground, for example) by way of a circuit trace 16 on a different layer of the circuit board 10 than the signal contacts 14 since it is undesirable for the wipers 31 to contact a trace.

A preferred embodiment of the present invention comprises a printed circuit board 10 having the edge connector 11 disposed adjacent to one edge thereof. The edge connector 11 comprises a plurality of contacts 12, 13, 14 disposed adjacent to and separated from each other that are offset from the edge of the printed circuit board 10.

In a preferred embodiment, the edge connector 11 comprises a plurality of fingerlike contacts 12, 13, 14 including a ground contact 12, a power contact 13, and a plurality of signal contacts 14. The ground contact 12 has a square tip that helps attract electrostatic discharge signals and is also the longest contact to provide a ground connection before power or signal contacts 13, 14 are contacted. The power contact 13 is the next longest contact and applies power to the circuit board 10 before any signal contact 14 is contacted. The signal contacts 14 are disposed the furthest distance from the edge of the circuit board 10.

In the preferred embodiment, the row of vias 15 are disposed between each signal contact 14 and are located between the outer edge of the circuit board 10 and the plurality of signal contacts 14. The vias 15 are disposed between the signal contacts 14 so that connector wipers 31 do not get damaged by the vias 15. The shape of the vias 15 is elongated to provide better electrostatic discharge attraction. The vias 15 are connected to an electrostatic discharge reference voltage (ground, for example) by way of a circuit trace 16 on a separate layer of the circuit board 10.

Thus, an edge connector having electrostatic discharge features that prevent the occurrence of electrostatic discharge events, and a digital camera employing same, have been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A digital camera, comprising:
    a body;
    a circuit board; and
    an edge connector comprising a ground contact, a power contact, and a plurality of signal contacts disposed at predetermined distances from an edge of the circuit board, and a row of vias disposed between the signal contacts and the edge of the circuit board, and wherein each respective edge connector signal contact has a via disposed on either side thereof.

2. The digital camera recited in claim 1 wherein the ground contact comprises a square tip that helps attract electrostatic discharge signals.

3. The digital camera recited in claim 1 wherein the ground contact is the longest contact to provide a ground connection before power or signal contacts are contacted.

4. The digital camera recited in claim 3 wherein the power contact is the next longest contact.

5. The digital camera recited in claim 4 wherein the power contact applies power to the circuit board before any signal contact is contacted.

6. The digital camera recited in claim 1 wherein the signal contacts are furthest from the edge of the circuit board.

7. The digital camera recited in claim 1 wherein the shape of the vias is elongated.

8. The digital camera recited in claim 1 wherein the vias are connected to an electrostatic discharge reference voltage.

9. The digital camera recited in claim 1 wherein the vias are connected to an electrostatic discharge reference voltage by way of a circuit trace disposed on a different layer of the circuit board than the signal contacts.

* * * * *